US011808797B1

(12) United States Patent
Bryant et al.

(10) Patent No.: US 11,808,797 B1
(45) Date of Patent: Nov. 7, 2023

(54) HEMISPHERICAL DOME ELECTRODE CONFIGURATION AND METHOD OF USE

(71) Applicant: EarthSystems Technologies, Inc., Carrollton, TX (US)

(72) Inventors: John Bryant, Dallas, TX (US); Frederick Hershel Savage, Austin, TX (US); Timothy Beets, Austin, TX (US)

(73) Assignee: EarthSystems Technologies, Inc., Carrollton, TX (US)

( * ) Notice: Subject to any disclaimer, the term of this patent is extended or adjusted under 35 U.S.C. 154(b) by 197 days.

(21) Appl. No.: 17/249,974

(22) Filed: Mar. 19, 2021

(51) Int. Cl.
*G01R 27/08* (2006.01)
*G01V 3/20* (2006.01)

(52) U.S. Cl.
CPC ............... *G01R 27/08* (2013.01); *G01V 3/20* (2013.01)

(58) Field of Classification Search
None
See application file for complete search history.

(56) References Cited

U.S. PATENT DOCUMENTS 2,172,778 A 9/1939 Taylor
2,307,887 A 1/1943 Haynes
3,735,249 A 5/1973 Stoll
3,968,428 A 7/1976 Numoto
4,023,140 A 5/1977 Siems et al.
4,319,347 A 3/1982 Savit
5,357,202 A 10/1994 Henderson
5,537,045 A * 7/1996 Henderson ........... G01N 27/043 324/718
5,920,828 A 7/1999 Norris et al.
6,226,601 B1 5/2001 Longaker
6,332,109 B1 12/2001 Sheard et al.
6,359,438 B1 3/2002 Bittar
6,404,203 B1 * 6/2002 Lagmanson ............. G01V 3/02 324/362
6,549,012 B2 4/2003 Stolarczyk
6,674,286 B2 1/2004 Lagmanson
6,804,625 B1 10/2004 Bryant
6,916,983 B2 7/2005 Orsini et al.
6,977,867 B2 12/2005 Chamberlain
7,069,780 B2 7/2006 Ander
7,158,048 B2 1/2007 Abdelhadi
7,239,154 B2 7/2007 Lundstrom
7,269,095 B2 9/2007 Chamberlain et al.
(Continued)

FOREIGN PATENT DOCUMENTS

JP 3944335 B2 7/2007
KR 101274251 B1 6/2013
(Continued)

OTHER PUBLICATIONS

Tanaka, Hiroyuki KM. "Muographic mapping of the subsurface density structures in Miura, Boso and Izu peninsulas, Japan." Scientific reports 5 (2015): 8305.
(Continued)

*Primary Examiner* — Douglas X Rodriguez
(74) *Attorney, Agent, or Firm* — Schultz & Associates, P.C.

(57) ABSTRACT

An electrical resistivity tomography system having a novel electrode geometry and method of use is provided. The novel electrode geometry radiates a uniform electric field which produces greatly improved resistivity data.

19 Claims, 10 Drawing Sheets

(56) References Cited

U.S. PATENT DOCUMENTS

| | | | | |
|---|---|---|---|---|
| 7,299,133 | B2 | 11/2007 | Duncan et al. | |
| 7,353,132 | B2 | 4/2008 | Sheard et al. | |
| 7,386,402 | B2 | 6/2008 | Bryant | |
| 7,388,382 | B2 | 6/2008 | Strack et al. | |
| 7,633,296 | B2 | 12/2009 | Safinya et al. | |
| 7,663,973 | B2 | 2/2010 | Chamberlain | |
| 7,689,364 | B2 | 3/2010 | Lagmanson et al. | |
| 7,788,049 | B2 | 8/2010 | Bryant et al. | |
| 7,813,883 | B2 | 10/2010 | Bryant | |
| 8,019,547 | B2 | 9/2011 | Bryant | |
| 8,209,125 | B2 | 6/2012 | Berkovitch et al. | |
| 8,321,160 | B2 | 11/2012 | Bryant et al. | |
| 8,380,439 | B2 | 2/2013 | Lagmanson et al. | |
| 8,483,965 | B2 | 7/2013 | Bradley et al. | |
| 8,892,410 | B2 | 11/2014 | Krohn | |
| 8,965,705 | B2 | 2/2015 | Lagmanson et al. | |
| 9,051,832 | B2 | 6/2015 | Ahler et al. | |
| 9,151,861 | B2 | 10/2015 | Labrecque | |
| 9,158,022 | B2 | 10/2015 | Park et al. | |
| 9,293,843 | B2 | 3/2016 | Lu | |
| 9,638,821 | B2 | 5/2017 | Meyer | |
| 9,700,893 | B2 | 7/2017 | Moeny | |
| 9,921,330 | B2 | 3/2018 | Berglund | |
| 9,952,345 | B1 | 4/2018 | Harro | |
| 9,995,838 | B2 | 6/2018 | Labrecque | |
| 10,012,063 | B2 | 7/2018 | Storslett et al. | |
| 10,310,118 | B2 | 6/2019 | Willis | |
| 10,408,960 | B2 | 9/2019 | Berglund | |
| 2012/0112753 | A1 | 5/2012 | Wittle | |
| 2020/0084845 | A1* | 3/2020 | Zhang | H05B 7/20 |

FOREIGN PATENT DOCUMENTS

| | | | |
|---|---|---|---|
| WO | 9429752 | A1 | 12/1994 |
| WO | 2011158103 | A1 | 12/2011 |
| WO | 2015062327 | A1 | 5/2015 |
| WO | 2015002558 | A2 | 9/2015 |

OTHER PUBLICATIONS

Liaw, Alfred L., et al. “Microseisms in geothermal exploration studies in Grass Valley, Nevada.” Geophysics 44.6 (1979): 1097-1115.

Guffanti, Marianne, et al. “Volcano-monitoring instrumentation in the United States, 2008.” US Geological Survey Open-File Report 1165 (2009).

Jordan, R., et al. “The Mars express MARSIS sounder instrument.” Planetary and Space Science 57.14-15 (2009): 1975-1986.

Loke, M.H. “Electrical imaging surveys for environmental and engineering studies: A practical guide to 2-D and 3-D surveys.” (1997).

Batayneh, Awni T. “2D Electrical Imaging of an LNAPL Contamination, Al Amiriyya Station, Jordan.” Journal of Applied Sciences 5(1) : 52-59, 2005.

Cook, John C. “An Electrical Crevasse Detector” Geophysics, vol. 21, No. 4, 1956, p. 1055-70, 9 figs. Journal of Glaciology 3(22): 146-147.doi: 10.3189/S0022143000024485.

Schuster, C. L., et al. “Natural gas massive hydraulic fractureresearch and advanced technology project.” Quarterly report: Feb. 1977-Apr. 1977 (1977) doi: 10.2172/7318329.

Athanasiou, E.N. et al. “Non-destructive DC resistivity surveying using flat-base electrodes.” Near Surface Geophysics 5. (2007): doi: 10.3997/1873-0604.2007008.

Kiflu, H. G. “Improved 2D and 3D resistivity surveys using buried electrodes and optimized arrays: The multi-electrode resistivity implant technique (MERIT).” Graduate Theses and Dissertations. University of South Florida. (2016).

* cited by examiner

HEMISPHERICAL DOME ELECTRODE CONFIGURATION AND METHOD OF USE

FIELD OF THE INVENTION

The present invention relates to electrical resistivity tomography (ERT) systems for locating subsurface anomalies, such as variations in subsurface density and the presence of voids and groundwater.

BACKGROUND OF THE INVENTION

An ERT survey is a geophysical technique for imaging subsurface structures using electrical resistivity measurements made by electrodes impressed in the ground.

Resistivity can be computed if the intensity of a current injected into the ground, and the resulting potential difference established between measurement electrodes are known. Resistivity depends on the nature of the soil, the injected current, the method used to measure the injected current, the resulting potential difference between the electrodes and on the geometry of the electric field created between the electrodes.

In practice, an array of electrodes is driven into the ground in a known geometric topology. Generally, the topology is linear, but can be a 2-dimensional. Many topologies are known for electrode placement in an ERT survey. Among them are the Wenner, Wenner-Schlumberger, pole-dipole and dipole-dipole arrangements.

A known current is introduced through a pair of injection electrodes. An electric field results. The resulting electric field is measured as a voltage at measurement electrodes in the array. Resistivity valves at various depths in the ground can then be determined from the known current and the measured voltages.

A resistivity model is created using a least squares data inversion on the resistivity values that minimizes the error in the data. The resistivity model is then subjected to geostatistical analysis, using kriging or other methods to derive a resistivity map. The resistivity map includes equipotential lines indicating varying bands of resistivity at varying depths in the soil. The bands are then interpreted to identify subsurface moisture voids, density changes, and other anomalies. High resistivity typically is interpreted as stone or a void. Low resistivity is typically interpreted as water, or wet soil.

Referring to FIG. 1, a dipole-dipole topology 100 is shown. In the dipole-dipole topology, the spacing between the current injection probes 105 and the voltage measurement probes 107 is the same. The spacing is typically a whole number multiplier "n" of the distance "a".

Referring to FIG. 2, an example of a channel of test data in an ERT survey using a dipole-dipole topology 200 will be described. Electrodes 202, 204, 206, 208, 210, 212, 214, 216, 218, 220 and 222 are inserted in ground 224 at an equidistant spacing "a" in a straight line. A known current is injected at current injection probes 230. The resulting differential voltage at electrode pairs 237, 239, 241, 243, 245, 247, 249 and 251, is measured. The apparent resistivity of the subsurface can be determined from these measurements at different depths, forming a two-dimensional matrix of resistivity values. In this example, impressing a current injection probes 230 and taking a voltage reading at electrode pairs 237 results in a resistivity value for position 280 at depth 260 and horizontal distance 268. Similarly, a voltage reading at electrode pairs 239 results in a resistivity value for position 281 at depth 261 and distance 269.

Likewise, a voltage reading at electrode pairs 241 results in a resistivity value for position 282 at depth 262 and distance 270. A voltage reading at electrode pairs 243 results in a resistivity value for position 283 at depth 263 and distance 271. A voltage reading at electrode pairs 245 results in a resistivity value for position 284 at depth 264 and distance 272. A voltage reading at electrode pairs 247 results in a resistivity value for position 285 at depth 265 and distance 273. A voltage reading at electrode pairs 249 results in a resistivity value for position 286 at depth 266 and distance 274. A voltage reading at electrode pairs 251 results in a resistivity value for position 287 at depth 267 and distance 275. As can be seen, the farther away the voltage electrodes are from the current injection electrodes, the deeper into the earth the resistivity values are taken. The string of resistivity values for this single placement of the current injection probes can be termed a "channel" of resistivity data.

Referring to FIG. 3, in order to complete an ERT survey, several (or many) channels of data are required. After each set of voltage measurements is taken, the current injection probes are typically advanced in one direction along the array. For example, from position 302 to positions 304, 306, 308, 310, 312 and 314, in sequence. As different voltage differential measurements are taken, separate channels of resistivity readings are derived and advanced in the same sequence from channel 320, channel 322, to channel 324, to channel 328, to channel 330 and to channel 332. The channels form linear diagonal lines at approximately 45° from an interstitial position between the current injection nodes. The result is a set of differential resistivity values associated with a set of subsurface points directly below the electrodes. The set of differential resistivity values is then subjected to curve smoothing routines which result in a set of continuous equipotential lines on a resistivity "map" that can be interpreted to locate subsurface anomalies.

Many systems currently exist for carrying out an ERT survey. One such system is described in U.S. Pat. No. 8,019,547 to Bryant. The invention described in the '547 Patent employs reconfigurable nodes located at each electrode in the array operated by a master controller. One novel feature of the invention of the '547 Patent is that the nodes may be set as either current impression nodes or voltage measurement nodes. However, the geometry of each electrode itself is simply cylindrical. U.S. Pat. No. 8,019,547 is incorporated herein by reference.

U.S. Pat. Nos. 8,321,160; 7,788,049; 7,813,883 and 7,386,402 to Bryant similarly disclose the use of a reconfigurable array of electrodes inserted into the ground. The electrodes in the Bryant Patents are described as having a cylindrical geometry having a blunt end. U.S. Pat. Nos. 8,321,160; 7,788,049; 7,813,883 and 7,386,402 are incorporated herein by reference.

U.S. Pat. Nos. 11,513,244; 11,323,285; 11,329,843 and U.S. application Ser. No. 16/948,062 to Bryant disclose the use of nodes comprised of a hermetically sealed controller housing with controller boards interchangeably connected to electrodes inserted into the ground. Each of the electrodes in the Bryant Applications are described as having a cylindrical body with a sharpened tip to aid in driving each electrode into the ground. U.S. Pat. Nos. 11,513,244; 11,323,285; 11,329,843 and U.S. application Ser. No. 16/948,062 are incorporated herein by reference.

Another known system is described in U.S. Pat. No. 8,380,439 to Lagmanson. This system likewise includes a series of nodes which are reconfigurable. A current is located at a pair of electrodes and voltage measurement is taken at each other node pair. The '439 Patent discloses electrodes having a simple cylindrical geometry having an integrally formed conical tip.

U.S. Pat. Nos. 5,357,202 and 5,537,045, both to Henderson disclose directly monitoring the soil subjacent to a fluid containment area by burying electrodes. Henderson '202 discloses a plurality of four "plate-type" electrodes. A voltage and a known current are applied across the outer pair of plates. The resulting potential difference is measured across the inner pair of plates. Henderson '045 also discloses a system of individual electrodes that, by impressing a current into the ground and varying the spacing of the potential measurement electrodes, can indirectly measure the resistivity at a calculated depth.

U.S. Pat. No. 6,404,203 to Lagmanson discloses a system for measuring voltage potentials in the ground. Lagmanson describes a system with an array of devices, each having two electrodes, a polarizable electrode coupled with a non-polarizable electrode. The polarizable electrode is formed from a metallic stake. The non-polarizable electrode is formed from a porous material having a ceramic tip. The geometry of each electrode is disclosed as cylindrical terminating in a conical tip.

In all cases, the current state of the art is unsatisfactory because the geometry of the electrodes skews the electric field impressed in the ground by the injection electrodes and the induced electric field at the measurement electrodes which greatly skews resulting resistivity data.

In a dipole-dipole topology, resistivity can be calculated from the following equation:

$$P_A = \frac{V}{I}\pi An(n+1)(n+2) \qquad \text{Eq. 1}$$

Where:

n=the integer value representing the spacing distance from the current injection electrodes to the measurement electrodes π=a constant A=internode spacing $P_A$=resistivity V=voltage potential measured across neighboring measurement electrodes I=current impressed at the injector electrodes.

When an injector electrode is charged by an electric current, an electric field is created in the surrounding material. The electric field created allows an electric charge to travel between the electrode and the surrounding material.

The electric field of an object at a specified point is expressed as the electric force divided by the electric charge of the test body. However, a large test charge may disturb the charges responsible for creating the electric field. As a result, the electric field at a specified point should be calculated using the following equation:

$$E = \lim_{q_0 \to 0} \frac{F}{q_0} \qquad \text{Eq. 2}$$

Where:

E=the electric field

F=the electric force acting on the body $q_0$=the test charge of the body.

The density of an electric field, E, decreases as the distance from the center of the charge increases. For a uniform spherical test body, E is the same for all points that lie a given distance from the center of the charge. The E for a group of points may be calculated by a summation of the electric field for each point. Where the charge distribution is continuous, the magnitude of E for any point P may be calculated by dividing the charge into infinitesimal elements. The field due to each element is calculated according to the following equation:

$$dE = \frac{1}{4\pi\epsilon_0}\frac{dq}{r^2} \qquad \text{Eq. 3}$$

Where:

dq=the charge element $\in_0$=the permittivity constant ($8.85\times10^{-12}$ farad/meter)

r=the distance from the charge element dq to the point P.

The resultant field at P is found by integrating the field contributions due to all the charge elements as follows:

$$E=\int dE$$

The electric field produced at point P is calculated as a summation of the resultant fields due to each pole at point P on the surface of the electrodes.

In an ERT system, when a current is injected at the injection nodes the electrical charge is evenly and instantly distributed along the surface of each electrode. Once the electrode is charged, the electric field radiates at approximately a perpendicular angle from the surface of the electrode. Hence, surface geometry of each electrode is critical to the generation of a uniform electric field.

Referring then to FIG. 4, prior art ERT system 400 is comprised of master controller 402 operatively connected to current supply 404. Current supply 404 provides current for master controller 402 to conduct the ERT survey. ERT system 400 is further comprised of injection nodes 452 and 454 and measurement nodes 456 and 458. Injection node 452 is comprised of controller 406 mechanically and electrically connected to electrode body 407. Injection node 454 is comprised of controller 408 mechanically and electrically connected to electrode body 409. Measurement node 456 is comprised of controller 410 mechanically and electrically connected to electrode body 411. Measurement node 458 is comprised of controller 412 mechanically and electrically connected to electrode body 413. The master controller is operatively connected to controllers 406, 408, 410, and 412. Examples are described in U.S. Pat. Nos. 8,019,547; 8,321,160; 7,788,049; 7,813,883; 7,386,402; 11,513,244; 11,323,285; and 11,329,843 U.S. application Ser. No. 16/948,062, to Bryant, et al., incorporated herein by reference.

The electrode bodies are comprised of a metal stake, such as stainless steel, having a cylindrical body and integrally formed conical tip terminating in a flat surface. Electrode body 407 is comprised of cylindrical body 422 and integrally formed conical tip 430 with flat surface 453. Electrode body 409 is comprised of cylindrical body 424 and integrally formed conical tip 432 with flat surface 455. Electrode body 411 is comprised of cylindrical body 426 and integrally formed conical tip 434 with flat surface 457. Electrode body 413 is comprised of cylindrical body 428 and integrally formed conical tip 436 with flat surface 459.

Current received from master controller 402 is injected into the subsurface via injection nodes 452 and 454. The resulting electrical field extends perpendicularly from the surface of each node along its entire length. For example, equipotential lines radiating perpendicularly from cylindrical bodies 422 and 424 extend generally parallel to the ground surface and to each other.

Cylindrical region electrical field 438 results in and is depicted by parallel equipotential lines between cylindrical body 422 of electrode body 407 and cylindrical body 424 of electrode body 409. As can be seen, cylindrical region electrical field 438 is artificially dense.

Likewise, the equipotential lines radiating from each conical tip radiate perpendicularly from each conical surface at generally a 45° angle to the ground. Conical region electrical field 440 results in and is depicted by parallel curved equipotential lines between the surfaces of conical tip 430 and conical tip 432. It can be seen that in a second region of high density electrical field results in conical region electrical field 440. Also importantly, a low density "gap" 461 is created between cylindrical region electrical field 438 and conical region electrical field 440 resulting in artificially high resistivity values in the gap. Whereas the conical region electrical field 440 appears artificially compacted.

Tip region electrical field 442 is depicted by expanding curved equipotential lines extending downward between flat surface 453 and flat surface 455. The flat surfaces result in an artificial reduction in field density in tip region electrical field 442. A second low density gap 462 is also created in the electric field between conical region electrical field 440 and tip region electrical field 442.

In a similar fashion, the induced electrical field at measurement nodes 456 and 458 is distorted at by the geometry of the measurement electrodes.

For example, cylindrical region induced electrical field 446 is depicted by parallel equipotential lines between cylindrical body 426 and cylindrical body 428. The electric field in this region is more dense than it should be.

Conical region induced electrical field 448 is depicted by parallel curved equipotential lines between conical tip 434 and conical tip 436. The electrical field in the region is also overly dense. Artificial gap 464 is created between cylindrical region induced electrical field 446 and conical region induced electrical field 448. The electric field in this gap is artificially low.

Tip region induced electrical field 450 is depicted by expanding curved equipotential lines extending downward between flat surface 457 and flat surface 459. The expanding curved equipotential lines indicate an artificially low electric field region below and between the electrodes. Gap 466 is an artificially low electric field region created between conical region induced electrical field 448 and tip region induced electrical field 450.

Upon completion of an ERT survey, master controller 402 reports data based on the measured resistivity at the measurement nodes. However, because the electrical field is artificially distorted by the surface geometry of the electrodes, the data returned is likewise distorted, resulting in incorrect identification of high and low conductivity regions in the soil. For example, the artificially high density of cylindrical region induced electrical field 446 results in artificially low resistivity values, which when interpreted, indicates incorrectly high conductivity, or wet soil. Gap 464 results in artificially high resistivity values which, when interpreted indicate an overly dense subsurface region. The conical region induced electrical field 448 appears artificially high, resulting in incorrectly low resistivity values. Likewise, the artificial low density of tip region induced electrical field 450 results in artificially high resistivity values which when interpreted, indicate incorrectly low conductivity which is interpreted as an overly dense subsurface regions during the ERT data analysis.

Distortions in the electrical field are more pronounced when an electrode geometry is a flat plate or has a blunt tip as described in the prior art. Distortions in the electric field are also more pronounced when the geometries of paired electrodes are mismatched, such as when one electrode of a pair is a flat plate and the other electrode of the pair is cylindrical.

Referring then to FIG. 5, ERT test survey 500 will be described. ERT test survey 500 is a graphical representation of an ERT survey conducted using a prior art electrode array, employing a prior art cylindrical electrode geometry, comprised of twenty nodes at positions 510, 511, 512, 513, 514, 515, 516, 517, 518, 519, 520, 521, 522, 523, 524, 525, 526, 527, 528 and 529. Each of the nodes is placed at an internode spacing of about 1 meter. Equipotential shades indicate electrical resistivity profiles ranging from about 5 Ohms/meter at depth 502 to about and 200 Ohms/meter at depth 504. Artificially low resistivity readings are shown at depth range 506. Artificially high resistivity readings are shown at depth range 508, between 1 and 4 meters below the surface.

As a result, the soil properties may be misinterpreted based on the inaccuracies in the resistivity data obtained using prior art electrode geometry.

Thus, there is a need in the art for a means of injecting current into the ground which creates an undistorted induced electrical field between the measurement electrodes.

BRIEF DESCRIPTION OF THE DRAWINGS

In the detailed description of the preferred embodiments presented below, reference is made to the accompanying drawings.

DETAILED DESCRIPTION OF THE INVENTION

In the description that follows, like parts are marked throughout the specification and figures with the same numerals, respectively. The figures are not necessarily drawn to scale and may be shown in exaggerated or generalized form in the interest of clarity and conciseness.

Figure 1:
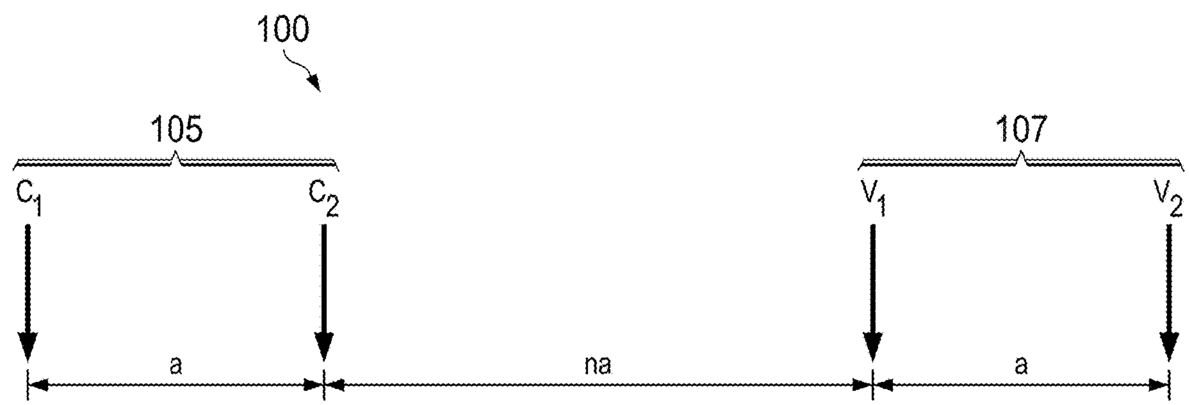
FIG. 1 is a schematic diagram of a dipole-dipole arrangement topology.
Figure 3:
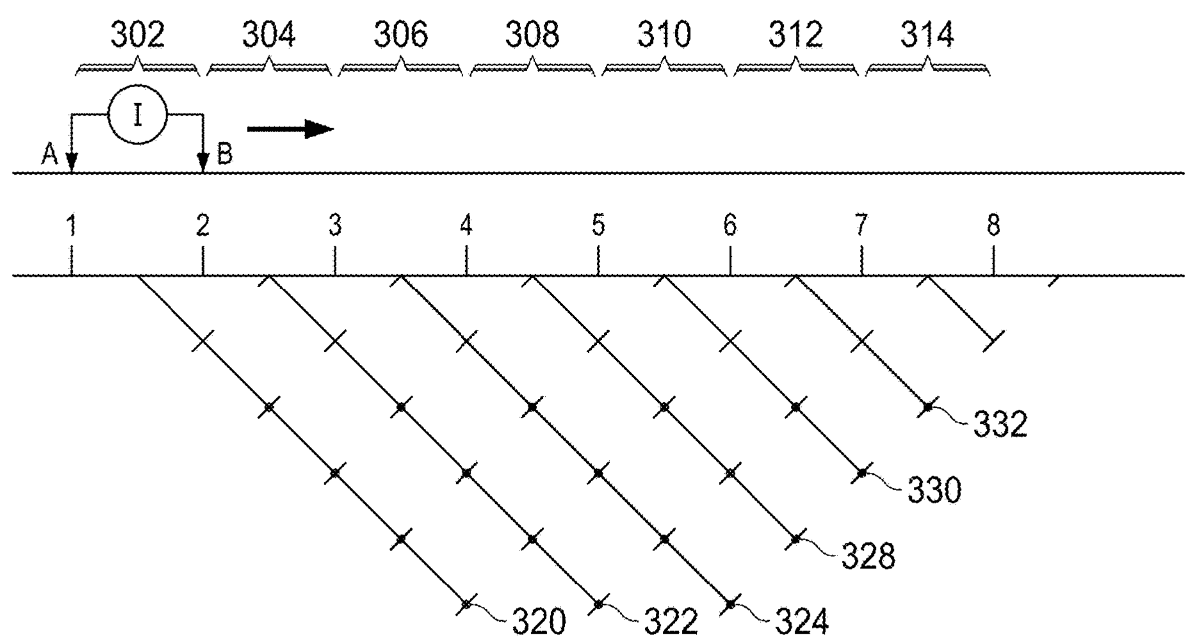
FIG. 3 is a schematic diagram of a set current injection probes traversing a dipole-dipole topology.
Figure 2:
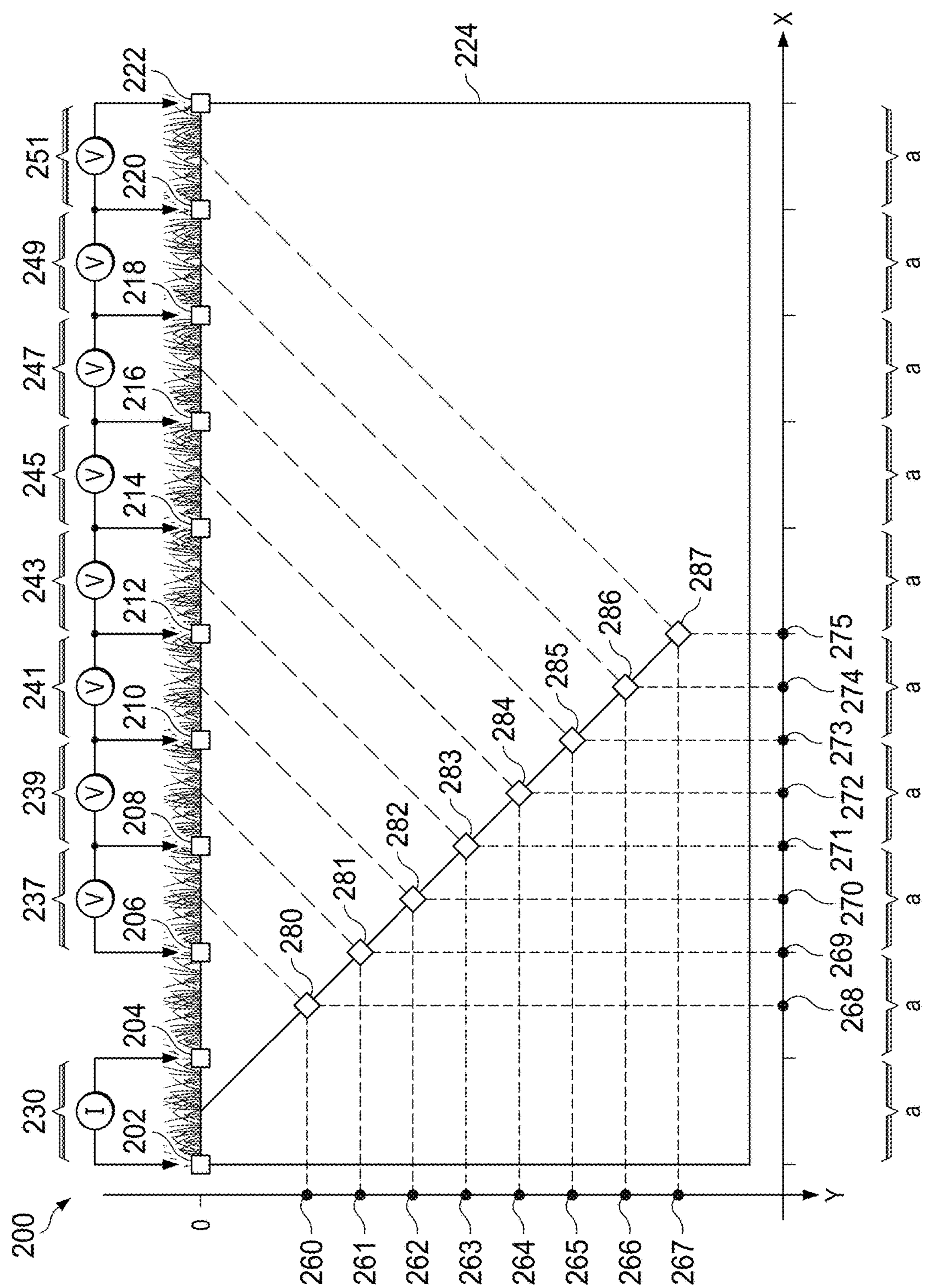
FIG. 2 is a schematic diagram of a typical dipole-dipole test data channel.
Figure 4:
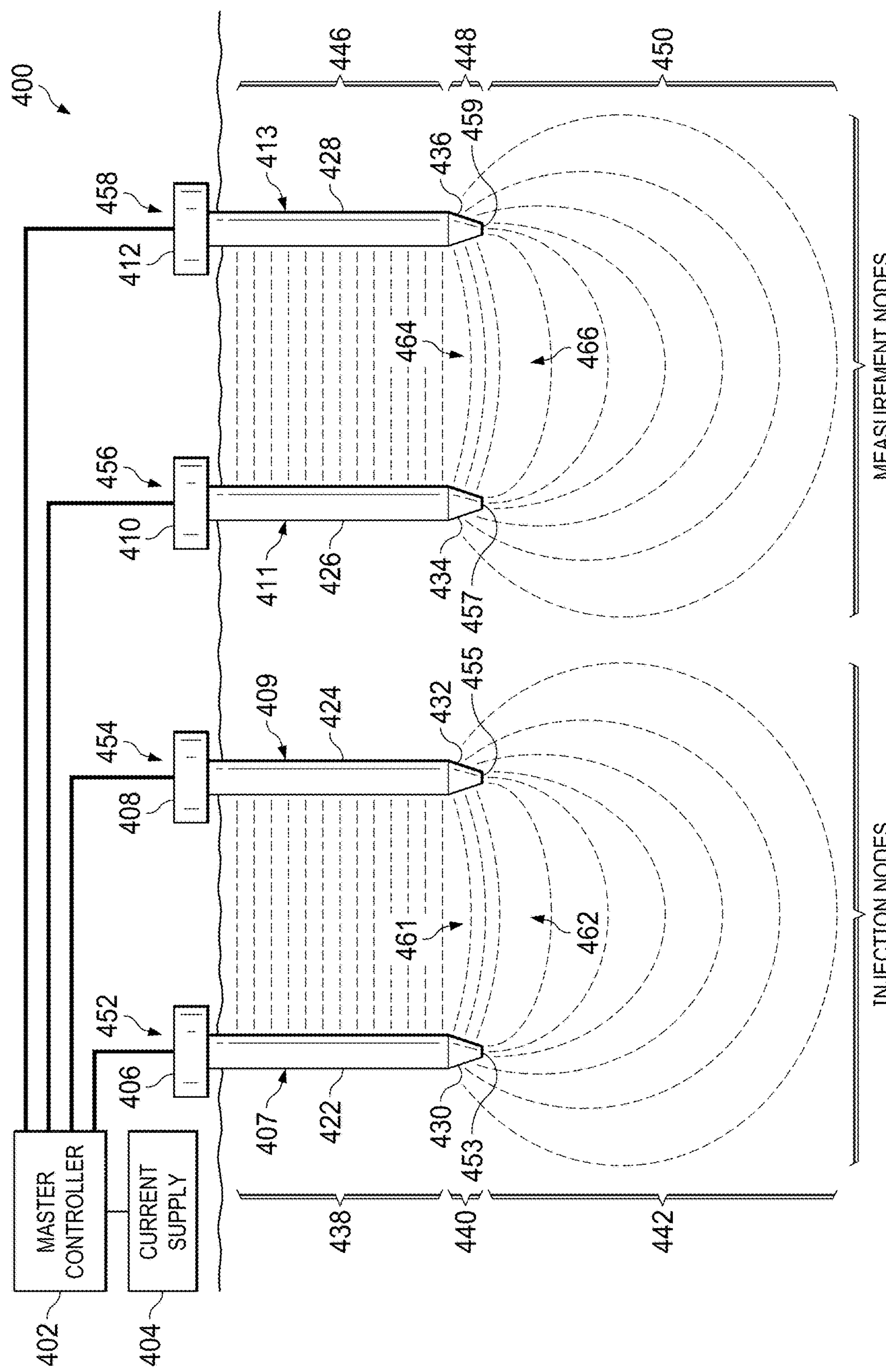
FIG. 4 is a schematic diagram of a prior art embodiment of an ERT system.
Figure 5:
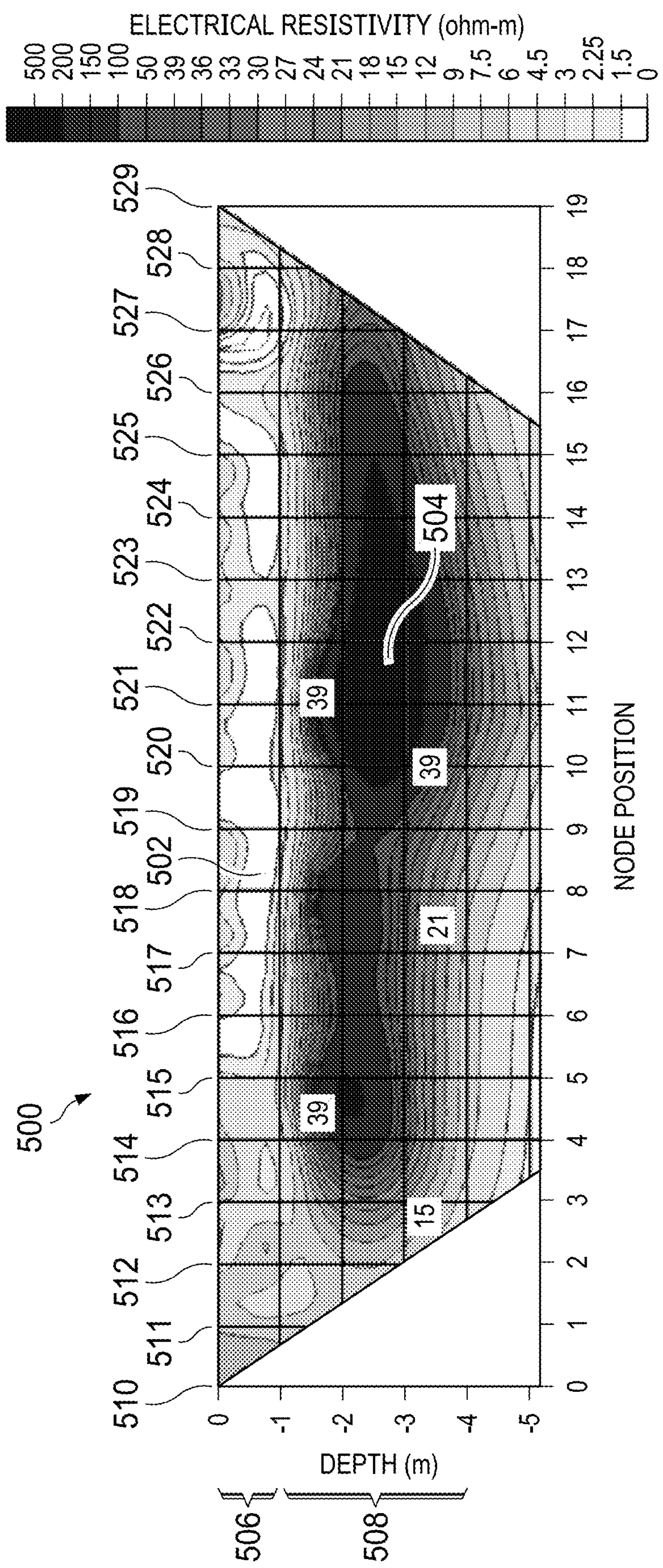
FIG. 5 is an example of a survey ERT map resulting from a field test of a prior art ERT system.
Figure 6A:
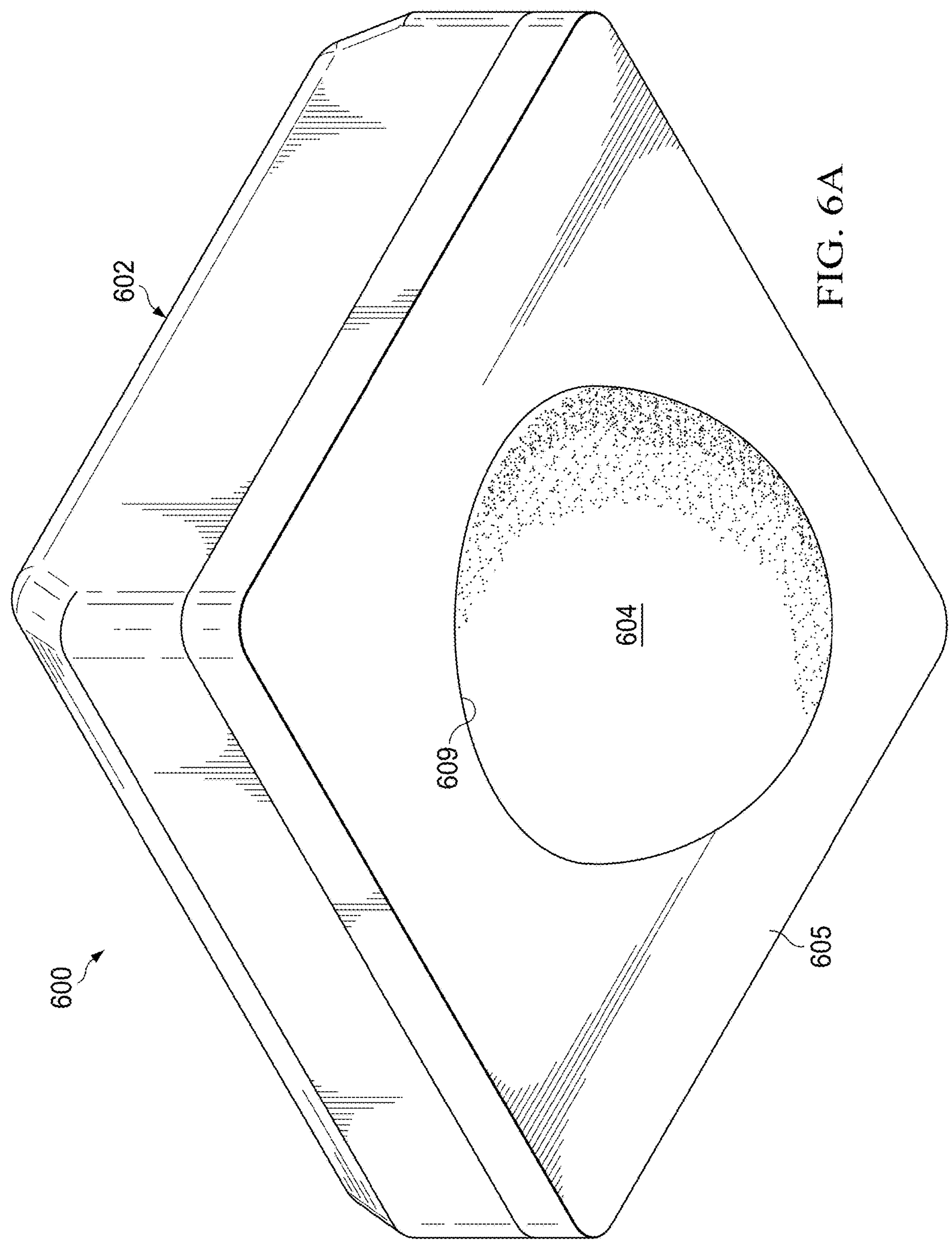
FIG. 6A is an isometric view of a preferred embodiment of a current injection probe.
Figure 6B:
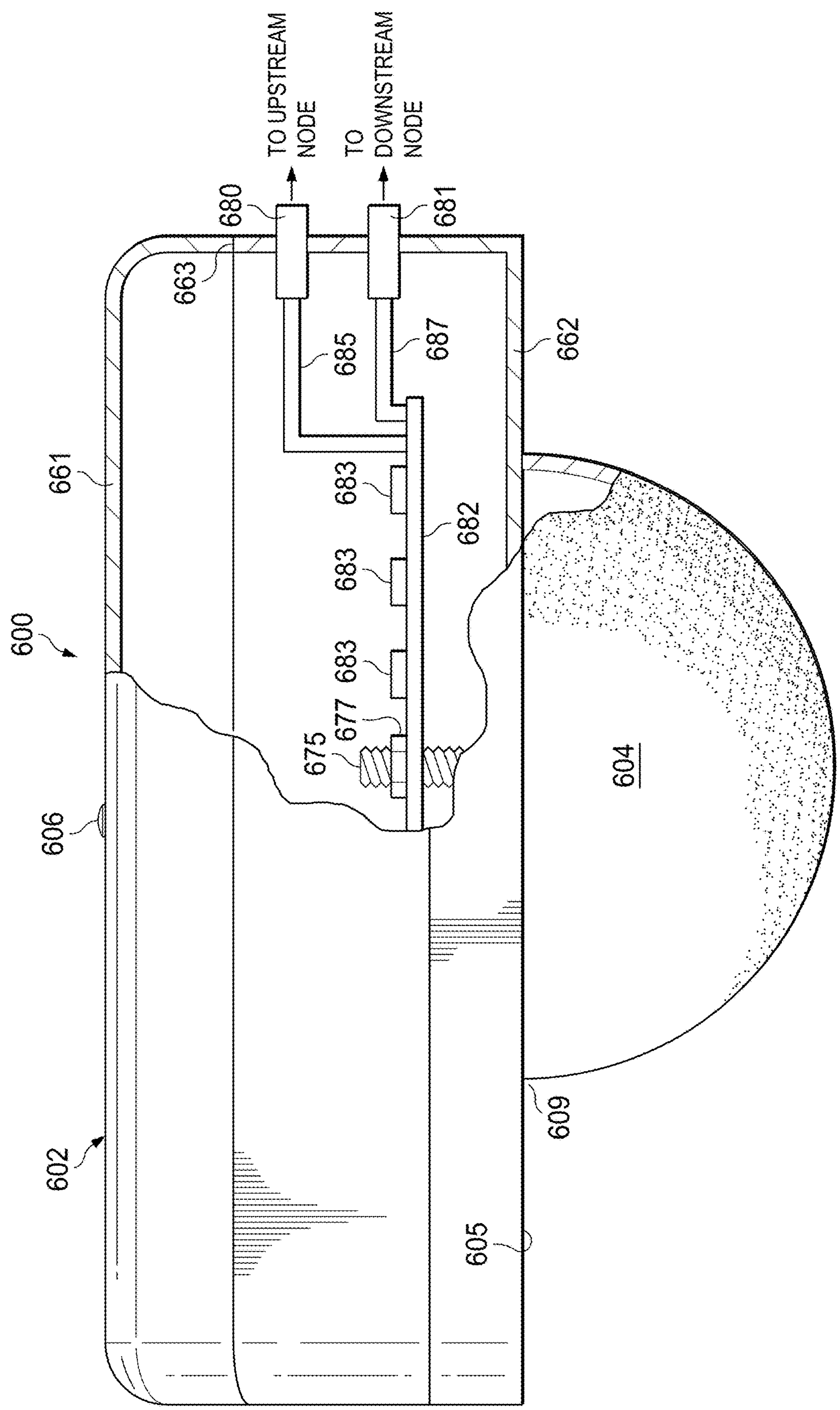
FIG. 6B is a cutaway plan side view of a preferred embodiment of a current injection probe.

In FIGS. 6A and 6B, a preferred embodiment of node 600 is shown. Node 600 is comprised of controller 602 and dome electrode 604. Controller 602 is comprised of a hermetically sealed housing with status indicator light 606 as further described in U.S. Pat. Nos. 11,513,244; 11,323,285; and 11,329,843 and U.S. application Ser. No. and 16/948,062. The housing includes an electronic control board potted in epoxy which is connected to a master controller, as will be further described.

Dome electrode 604 in a preferred embodiment is integrally formed of a single metallic material and is hemispherical. Preferably, dome electrode 604 is about 4 inches in diameter with a tolerance of ±0.1 inch. Further, each dome electrode deployed in an ERT array should be the same size and oriented downwardly with each electrode vertical axis generally parallel along parallel vertical central axes. The uniform construction from a single metallic material is important because it creates a uniform charge density on the dome surface which aids in production of a uniformly radiating electric field when in use. The dome electrode is mechanically and electrically connected to bottom 605 of controller 602 at interface 609, as will be further described. In a preferred embodiment, dome electrode 604 is comprised of stainless steel. In alternate embodiments, dome electrode 604 may be comprised of Zinc, Tin, Platinum, Copper, Brass, or another metal or alloy with sufficiently high conductivity for charge density on its surface to be uniform.

Referring to FIG. 6B, a cut away view for a preferred embodiment of node 600 is shown.

Controller 602 further comprises lower container 662 and upper container 661. The lower container and the upper contained are fused at interface 663. In a preferred embodiment, interface 663 is a hermetical seal and prevents moisture intrusion from the exterior of the node to its interior. The hermetical seal is especially important when the controller is buried, as will be further described.

Lower container 662 mechanically supports PC board 682 in a central position above dome electrode 604. PC board 682 likewise supports integrated circuits 683 which are operatively connected as required. PC board 682 further is connected to connector bus 685 and connector bus 687. Connector bus 685 is further connected to connector 680. Connector bus 687 is further connected to connector 681. Each of connectors 680 and 681 are operatively connected to other upstream or downstream nodes, as will be further described. Dome electrode 604 is connected to PC board 682 through steel bolt 675. Steel bolt 675 is anchored to PC board 682 with hex nut 677. PC board 682 is further operatively connected to status indicator light 606, as previously described.

Figure 7:
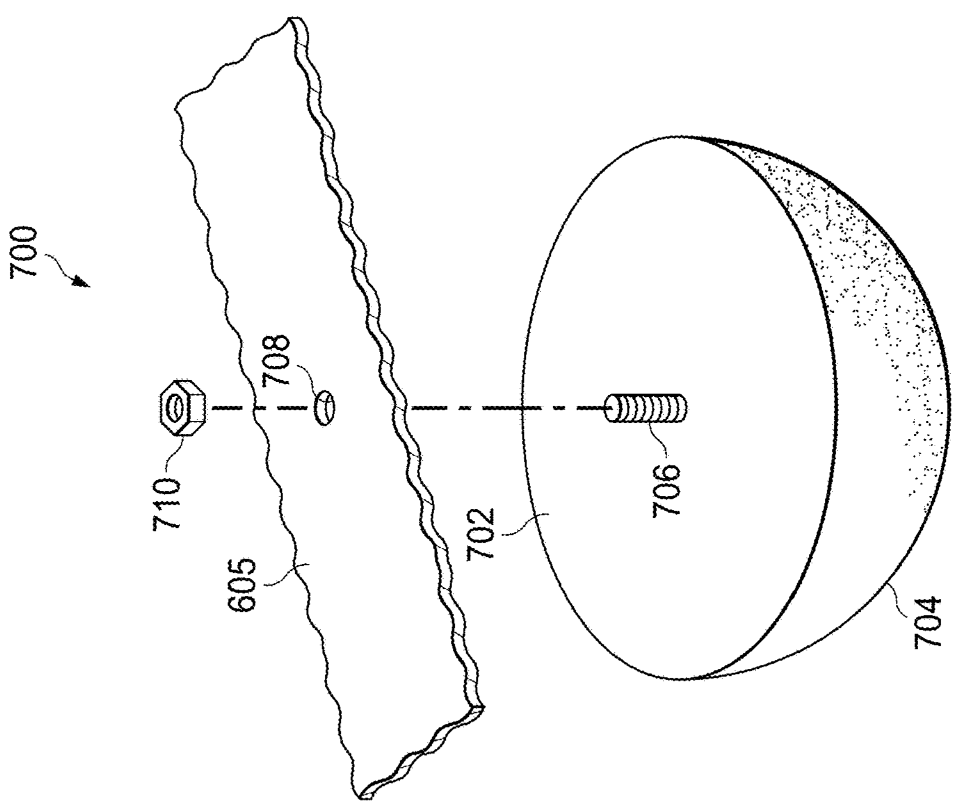
FIG. 7 is an isometric view of an electrode in a preferred embodiment of a current injection probe.

Referring then to FIG. 7, preferred embodiment of dome electrode 700 is shown. Dome electrode 700 is hemispherical in shape, equatorially terminating at the body of the controller. Dome electrode 700 is comprised of a single ingot of stainless steel, having a flat surface 702 and dome surface 704. Flat surface 702 is bonded to bottom 605 at interface 609, with epoxy or another suitable industrial adhesive. Anchor bolt 706 is fixed in flat surface 702 and extends through hole 708 in bottom 605. Anchor bolt 706 is secured by nut 710. Anchor bolt 706 provides electrical connection to the control board and also provides mechanical stability to the connection between the dome and the bottom surface of controller 602.

Figure 8:
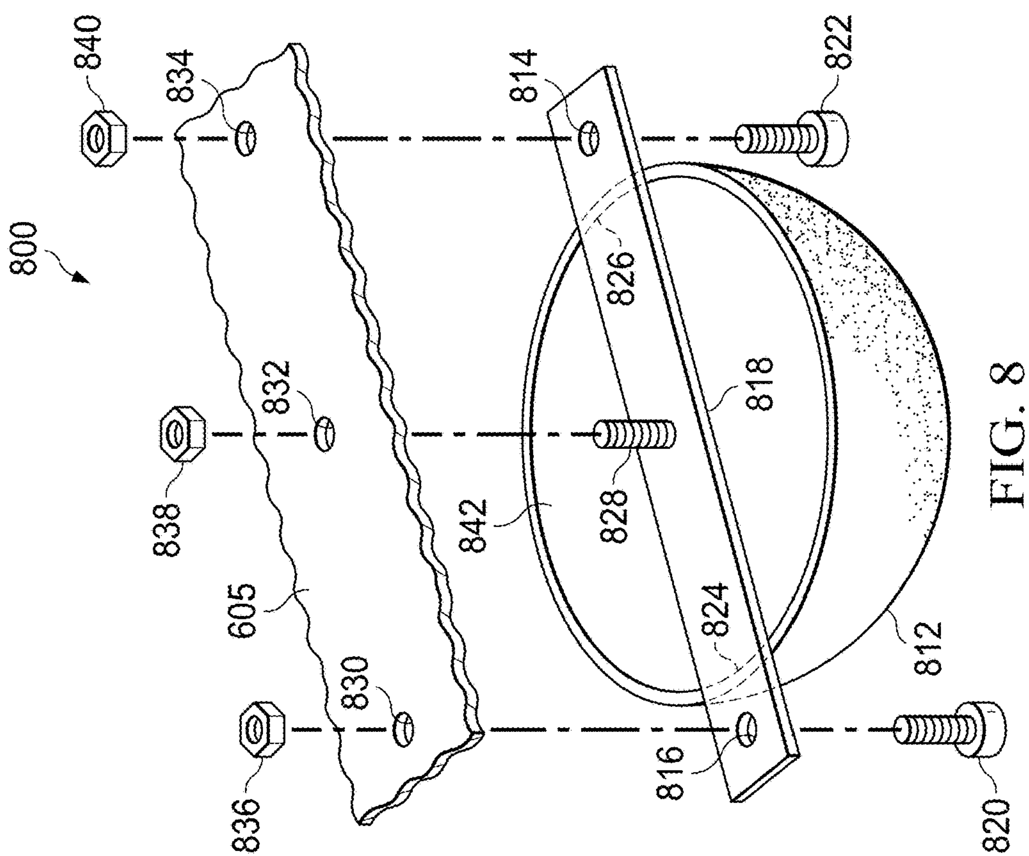
FIG. 8 is an isometric view of an alternate electrode in a preferred embodiment of a current injection probe.

Referring then to FIG. 8, alternate embodiment of dome electrode 800 is shown. Dome electrode 800 is comprised of hollow hemispherical dome 812. Hollow hemispherical dome 812 is comprised of an integrally formed metallic spun shell about 4" in diameter with a tolerance of 0.060". Preferred materials include steel, stainless steel, Iconel®, Hastelloy®, Monel®, and titanium. Hollow hemispherical dome 812 is mechanically fixed to bracket 818 at spot welds 824 and 826. Bracket 818 includes holes 816 and 814 and threaded mounting stud 828. Bracket 818 is mechanically connected to bottom 605 by bolts 820 and 822, through holes 830 and 834, secured by nuts 836 and 840. Similarly, bracket 818 is electrically connected to the control board by threaded mounting stud 828, through hole 832 and secured by nut 838. Bracket 818 is also preferably manufactured from stainless steel or titanium.

In another preferred embodiment, interior 842 may be filled with an inert solid material such as an epoxy resin to add mechanical stability to the dome.

Figure 9:
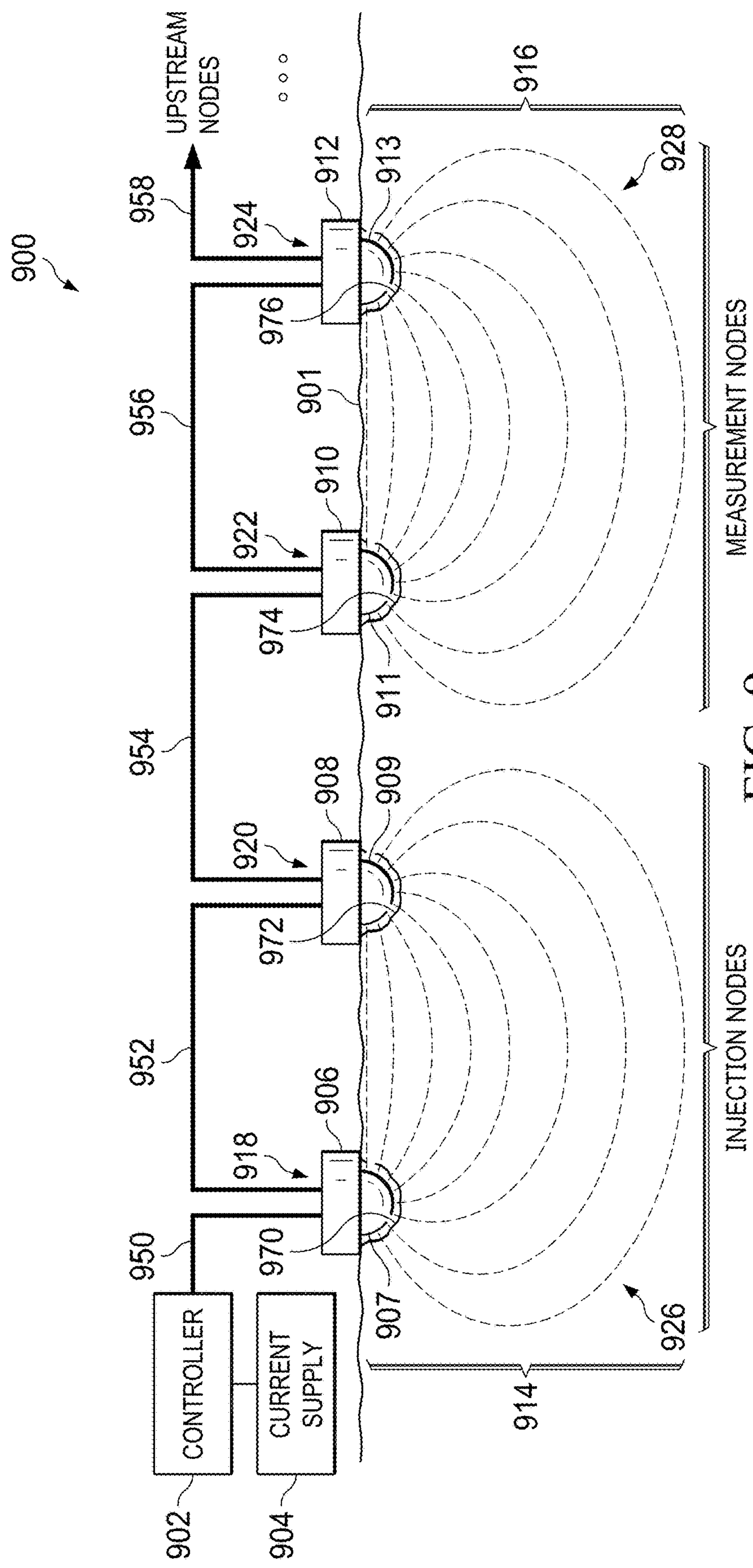
FIG. 9 is a schematic diagram of a preferred embodiment of an ERT system.

Referring then to FIG. 9, a preferred embodiment of ERT system 900 will be described. Master controller 902 is operatively connected to current supply 904. Current supply 904 provides current for master controller 902 to conduct the ERT survey. System 900 is further comprised of injection nodes 918 and 920 and measurement nodes 922 and 924. Injection node 918 is comprised of controller 906 mechanically and electrically connected to dome electrode body 907. Injection node 920 is comprised of controller 908 mechanically and electrically connected to dome electrode body 909. Measurement node 922 is comprised of controller 910 mechanically and electrically connected to dome electrode body 911. Measurement node 924 is comprised of controller 912 mechanically and electrically connected to dome electrode body 913. The master controller is operatively connected to controller 906 through line 950. Controller 906 is further connected to controller 908 through line 952. Controller 908 is connected to controller 910 through line 954. Controller 910 is connected to controller 912 through line 956. Controller 912 is connected to further upstream nodes (not shown) through line 958. Signals flow to and from the master controller through the daisy chained set of node controllers along these communication lines. Other daisy chain communications methods can replace the communications lines, such as Bluetooth and WiFi, as described in Bryant '244, '285 and '062.

Two measurement nodes are shown in the Figure as an example only. The preferred embodiment may include many nodes, all connected in a daisy chain fashion. However, the invention does not require a daisy chain connection between nodes and is equally useful with other node connection topologies.

Injection nodes 918 and 920 are impressed in indentions 970 and 972, respectively. Measurement nodes 922 and 924 are impressed in indentions 974 and 976, respectively. In this example, the electrode bodies are impressed in surface 901, but the controllers are above ground. In another preferred embodiment, the controllers may be buried below surface 901, with the electrodes. In another embodiment, the electrodes may be positioned in impressions that are filled with an electrolytic solution, as will be further described.

The electrode bodies are comprised of metallic hemispheres, as previously described. The controllers are each hermetically sealed, as previously described.

Current received from master controller 902 is injected into the subsurface via injection nodes 918 and 920.

Impressed electrical field 914 is depicted by uniformly expanding equipotential lines 926 between dome electrode body 907 and dome electrode body 909. Equipotential lines 926 eliminate perpendicularly from each electrode body.

The uniformity of the electrical filed in the impressed electrical field results in greatly increased accuracy in observed resistivity values during an ERT survey.

Master controller 902 receives resistivity data from controllers 910 and 912 based on induced electrical field 916 between electrode bodies 911 and 913. Induced electrical field 916 extends perpendicularly along uniformly expanding equipotential lines 928 from each of the domed surfaces of each of electrode bodies 911 and 913.

The uniformity of the induced electrical field results in greatly increased accuracy in observed resistivity values during an ERT survey.

Figure 10:
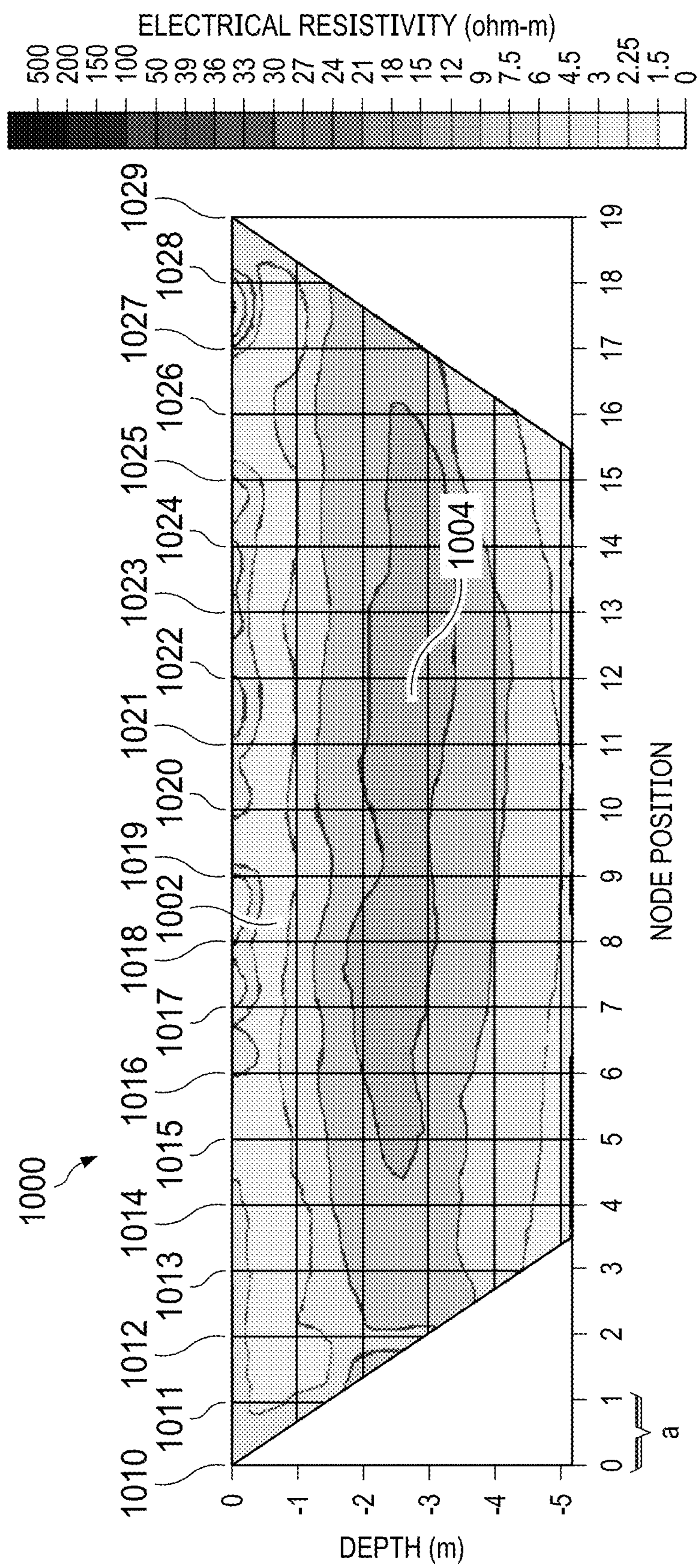
FIG. 10 is an example of a survey ERT map resulting from a field test of an ERT system employing a preferred embodiment of a hemispherical dome electrode.

Referring then to FIG. 10, an ERT test survey map 1000 will be described. ERT test survey map 1000 is a graphical representation of an ERT survey conducted using a preferred embodiment of the hemispherical dome electrode, as previously described. The topology of the ERT system included twenty nodes in a dipole-dipole topology at positions 1010, 1011, 1012, 1013, 1014, 1015, 1016, 1017, 1018, 1019, 1020, 1021, 1022, 1023, 1024, 1025, 1026, 1027, 1028 and 1029. Each of the nodes is placed at internode spacing about 1 meter. Equipotential shades indicate electrical resistivity profiles ranging from about 1.5 Ohms per meter at a depth 1002 to about 10 Ohms per meter at a depth 1004. Importantly, the survey of the preferred embodiment of the ERT system shows no artificially low resistivity readings at shallow depths and no artificially high resistivity readings at lower depths from the surface. As a result, soil properties are correctly interpreted based on accurate resistivity data obtained using novel the electrode geometry of a preferred embodiment.

Figure 11:
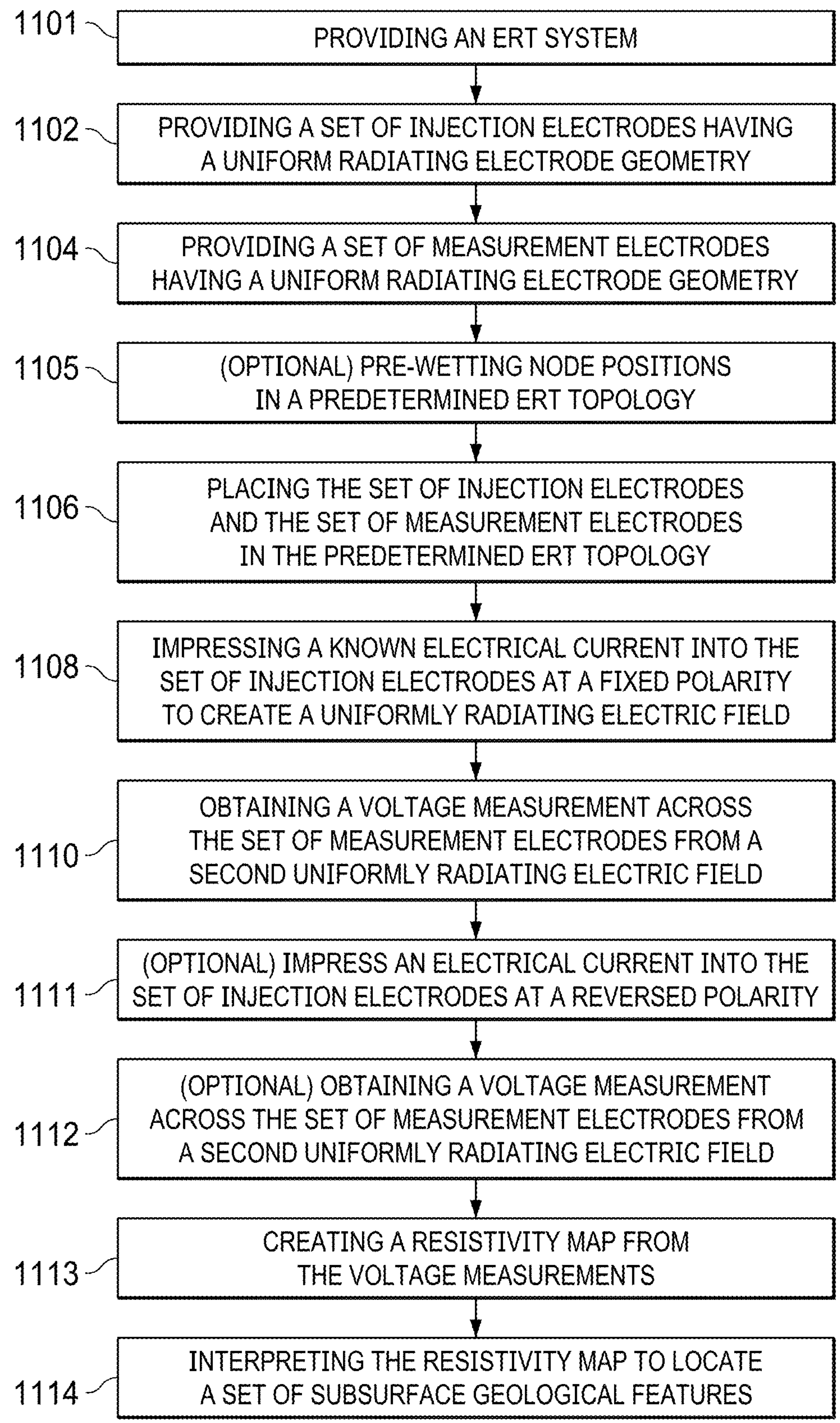
FIG. 11 is a flow chart depicting a preferred method of use of a set of hemispherical dome electrodes.

Referring to FIG. 11, a preferred use of a preferred embodiment, will be further described.

At step 1101, an ERT system is provided comprising a current supply in a controller connected to a set of remote nodes. In a preferred embodiment, the nodes are reconfigurable so that the placement of the injector nodes and the measurement nodes can be varied, and so that the polarity of the injector current can be changed to conduct various ERT surveys.

At step 1102, a set of injector electrodes is provided in the ERT system, each having a uniformly radiating electrode geometry, such as the hemispherical geometry described in a preferred embodiment of the invention.

At step 1104, a set of measurement electrodes is provided, each having a uniformly radiating electrode geometry, as previously described.

At step 1105, optionally, an impression in the ground at each node position for each of the electrodes in the predetermined ERT topology is flooded with deionized water in order to increase the conductivity between the electrode and the surrounding soil substrate. Other high conductivity fluids, such as brine or salt water, may be used to wet the node positions before the ERT survey begins.

At step 1106, the set of injector electrodes and a set of measurement electrodes are positioned in a predetermined ERT topology. In a preferred embodiment, the predetermined ERT topology is a dipole-dipole array, positioned above ground so that the status of the electrode controller may be monitored. In another preferred embodiment, each of the injector electrodes and measurement electrode and their corresponding controllers, are buried below the surface of the ground in a permanently installed system. Such systems have immense value in determining the presence of newly constructed tunnels or voids beneath the ERT system.

At step 1108, the controller impresses a known electrical current into the set of injector electrodes at a first polarity to create a uniformly radiating electric field at the set of injector electrodes.

At step 1110, a voltage measurement is obtained across the set of measurement electrodes from a second uniformly radiating electric field.

At step 1111, optionally, the controller impresses a second electrical current into the injector electrodes at a reversed polarity.

At step 1112, optionally, a voltage measurement is obtained across the set of measurement electrodes from a second uniformly radiating electric field.

At step 1113, a resistivity map is created from the voltage measurements. At step 1114, the resistivity map is interpreted to locate a set of subsurface geological features, such as a void, a tunnel, or subsurface liquid.

The invention claimed is:

1. An electrical resistivity tomography (ERT) survey system comprising:

- a current supply;
- a master controller operatively connected to the current supply;
- a pair of injection electrodes operatively connected to the master controller;
- a pair of measurement electrodes operatively connected to the master controller;
- each injection electrode of the pair of injection electrodes forming a radiating injector body which provides a uniform electrical field density;
- each measurement electrode of the pair of measurement electrodes forming a radiating measurement body which receives the uniform electrical field density; and,
- wherein the uniform electrical field density is produced during an ERT survey;
- wherein each radiating injector body is only hemispherical.

2. The ERT survey system of claim 1 wherein each radiating measurement body is only hemispherical.

3. The ERT survey system of claim 1 wherein each radiating injector body is formed of a metallic ingot.

4. The ERT survey system of claim 1 wherein each radiating measurement body is formed of a metallic ingot.

5. The ERT survey system of claim 1 wherein each radiating injector body is formed of a hollow shell.

6. The ERT survey system of claim 1 wherein each radiating measurement body is formed of a hollow shell.

7. An electrical resistivity tomography (ERT) node configuration comprising:

- an enclosure;
- a controller circuit, mechanically supported by the enclosure;
- a radiating electrode body, fixed to the enclosure and operatively connected to the controller circuit, which provides a uniform electric field density; and,
- the radiating electrode body is only hemispherical.

8. The ERT node configuration of claim 7 wherein the radiating electrode body is equatorially positioned on the enclosure.

9. The ERT node configuration of claim 7 wherein the radiating electrode body is a spun metallic shell.

10. The ERT node configuration of claim 7 wherein the radiating electrode body is a metallic material.

11. The ERT node configuration of claim 7 wherein the controller circuit is further operatively connected to a set of upstream nodes and a set of downstream nodes.

12. The ERT node configuration of claim 7 wherein the radiating electrode body is further comprised of:

a surface configuration for providing an evenly dispersed electric field during an ERT survey.

13. A method of conducting an ERT survey comprising:

providing a master controller including a current source;

providing a reconfigurable set of injector nodes having an only hemispherical configuration;

providing a reconfigurable set of measurement nodes having the only hemispherical configuration;

positioning the reconfigurable set of injector nodes and the reconfigurable set of measurement nodes in a predefined ERT topology;

impressing a known electrical current, by the master controller, from the current source, into the reconfigurable set of injector nodes;

obtaining a first voltage measurement, resulting from the known electrical current, across the reconfigurable set of measurement nodes; and, creating a resistivity map from the first voltage measurement.

14. The method of claim 13 further comprising:

impressing a reverse polarity electrical current, by the master controller from the current source, into the reconfigurable set of injector nodes; and, obtaining a second voltage measurement, resulting from the known electrical current, across the reconfigurable set of measurement nodes.

15. The method of claim 13 further comprising the step of:

providing the only hemispherical configuration as a monolithic metallic ingot.

16. The method of claim 13 further comprising the step of:

providing the only hemispherical configuration as a spun metallic shell.

17. The method of claim 13 further comprising:

locating a subsurface geological feature from the resistivity map.

18. The method of claim 13 further comprising:

providing the predefined ERT topology as one of a group of Wenner, dipole-dipole, pole-dipole and Wenner-Schlumberger.

19. The method of claim 13 further comprising:

pre-wetting a set of node positions in the predefined ERT topology.

* * * * *